(12) United States Patent
Kim et al.

(10) Patent No.: US 8,507,109 B2
(45) Date of Patent: Aug. 13, 2013

(54) MULTI-LAYER HARD FILE FOR INDEXABLE INSERT

(75) Inventors: Hyung Kwun Kim, Seoul (KR); Jae Hoon Kang, Seoul (KR); Jung Wook Kim, Chungju (KR); Seung Su Ahn, Chungju (KR); Sun Yong Ahn, Seoul (KR)

(73) Assignee: Korloy, Inc., Seoul (KR)

( * ) Notice: Subject to any disclaimer, the term of this patent is extended or adjusted under 35 U.S.C. 154(b) by 171 days.

(21) Appl. No.: 12/937,372

(22) PCT Filed: Mar. 18, 2009

(86) PCT No.: PCT/KR2009/001379
§ 371 (c)(1),
(2), (4) Date: Oct. 11, 2010

(87) PCT Pub. No.: WO2009/131310
PCT Pub. Date: Oct. 29, 2009

(65) Prior Publication Data
US 2011/0033723 A1 Feb. 10, 2011

(30) Foreign Application Priority Data

Apr. 24, 2008 (KR) .................. 10-2008-0038438

(51) Int. Cl.
*B32B 9/00* (2006.01)

(52) U.S. Cl.
USPC ............... 428/697; 51/307; 51/309; 428/698; 428/699

(58) Field of Classification Search
USPC .................. 51/307, 309; 428/697, 698, 699, 428/701, 702, 704
See application file for complete search history.

(56) References Cited

U.S. PATENT DOCUMENTS

| | | | | |
|---|---|---|---|---|
| 6,077,596 A * | 6/2000 | Hashimoto et al. | ........... | 428/216 |
| 7,056,602 B2 * | 6/2006 | Horling et al. | ................ | 428/697 |
| 7,504,149 B2 * | 3/2009 | Toihara et al. | ................ | 428/216 |
| 7,727,621 B2 * | 6/2010 | Nordlof et al. | .................. | 51/309 |
| 7,901,799 B2 * | 3/2011 | Feuerstein et al. | ............ | 428/698 |
| 7,923,130 B2 * | 4/2011 | Shibata et al. | ................ | 428/697 |
| 7,939,186 B2 * | 5/2011 | Takaoka et al. | ............... | 428/699 |
| 7,947,363 B2 * | 5/2011 | Xu et al. | ........................ | 428/698 |
| 8,003,232 B2 * | 8/2011 | Johansson et al. | ............ | 428/697 |
| 8,017,225 B2 * | 9/2011 | Takaoka et al. | ............... | 428/216 |
| 8,206,812 B2 * | 6/2012 | Selinder et al. | ................. | 51/307 |

FOREIGN PATENT DOCUMENTS

| | | |
|---|---|---|
| JP | 09104966 | 4/1997 |
| JP | 2006152321 | 6/2006 |
| KR | 100391501 | 7/2003 |
| KR | 1020060125564 | 12/2006 |

OTHER PUBLICATIONS

International Search Report for PCT/KR2009/001379 mailed Oct. 22, 2009.

* cited by examiner

*Primary Examiner* — A. A. Turner
(74) *Attorney, Agent, or Firm* — Christopher Paul Mitchell

(57) ABSTRACT

The present invention discloses a multi-layer hard film for an indexable insert. The multi-layer hard film for the indexable insert provided by the present invention is formed by sequentially depositing a base layer, an intermediate layer and a top layer with different composition ratios and film structures individually on the indexable insert, thus minimizing a delamination and tool wear which may occur in high speed machining.

3 Claims, No Drawings

MULTI-LAYER HARD FILE FOR INDEXABLE INSERT

RELATED APPLICATIONS

This application is a 371 application of International Application No. PCT/KR2009/001379, filed Mar. 18, 2009, which in turn claims priority from Korean Patent Application No. 10-2008-0038438, filed Apr. 24, 2008, both of which are incorporated herein by reference in their entireties.

TECHNICAL FIELD

The present invention relates to a film formed on a cemented carbide steel, such as an insert, an end mill, and a drill, and an indexable insert, such as a cermet tool, in more detail, a multi-layer hard film for indexable insert that has improved abrasion resistance and oxidation resistance by sequentially depositing a base layer, an intermediate layer and a top layer with different composition ratios and film structures.

BACKGROUND ART

In general, it is general to deposit N-base coated hard alloys, such as TiN, TiCN, and TiAlN, using an arc process or sputtering, which are physical vapor deposition, in order to improve abrasion resistance of indexable inserts/abrasion resistant tools. The TiAlN coated hard alloy is recently the most interested film in the metal cutting field because the abrasion resistance the highest under high temperature in the films.

However, although the TiAlN has high abrasion resistance due to high hardness, the shock resistance is lower than the TiN and TiCN films, such that it is generally not suitable to works with shock or middle/low speed works, while the TiN and TiCN may show the same behaviors, depending on work conditions.

Although it is possible to improve the abrasion resistance or the shock resistance by changing the type of deposition and the deposition factors, it is substantially difficult to improve both of the properties. In general, the abrasion resistance and the shock resistance are opposite properties and difficult to be simultaneously improved, such that the properties depend on the regions and the uses of the films; however, in general, both of the abrasion resistance and the shock resistance are required, such that it is substantially impossible to deposit a film having properties suitable for various workpieces under various machining conditions.

For this reason, the applicant(s) has recently proposed a secondary method for reducing the ratio of breakage due to mechanical shock by combining a TiN film or other films having good lubricity with a TiAlN film having good abrasion resistance, rather than improving the properties of the film itself, in Korean Patent Application No. 200343513, filed on 30 Jun., 2003.

However, the deposition time increases due to reduction of the evaporation source because an evaporation source for depositing the lubricant film is required, other than the evaporation source for depositing the main film.

Further, the tools are broken in continual cutting, because the basic properties of the film itself are not improved.

The applicant(s) has proposed "A TiAlN-based multi-layer with antiwear and antishockcoated to cutting tool" in Korean Patent Registration No. 100622912, in order to solve the problems, but it has a limit in increasing abrasion resistance and oxidation resistance.

On the other hand, high-speed machining is required to improve productivity, according to current industrial and technical trends, such that indexable inserts having a TiAlN film having more improved oxidation resistance, instead of TiN and TiCN, are commonly used.

Further, films have been continuously developed with the increase of cutting speed, and for example, a single film added with Si in an AlTiN film structure to improve oxidation resistance has been proposed in U.S. Pat. No. 5,580,653, while a multi-layer structure having one cycle of two films, depending on the contents of Si, in the second film structure has been proposed in U.S. Pat. No. 6,586,122.

However, in those patents, since the film containing Si has considerably high compressive stress as compared with the film without Si, it has large brittleness. Further, the film containing Si is easily separated when being directly deposited on an indexable insert, because of the high compressive stress.

There has been proposed a technology implementing a multi-layer film by depositing a film without Si on an indexable insert and applying different Si proportion to improve only the abrasion resistance and oxidation resistance, in order to solve the problems.

The technology, however, also has a problem in that two or more target sources with different Si content should be provided in a PVD coating apparatus and the targets with Si are expensive, such that it is economically disadvantageous.

Therefore, it is the most important to implement a multi-layer film structure that is economically advantageous by providing only one target with Si or Cr and has chipping resistance required by the patents described above or more improved chipping resistance, and a multi-layer film of which both of abrasion resistance and oxidation resistance are improved, in addition to the properties of the above multi-layer film structure.

DISCLOSURE

Technical Problem

The present invention has been made to solve the problems of the related art and it is an object of the present invention to provide a multi-layer hard film for an indexable insert that can minimize delamination and tool wear which may occur in high speed machining, by sequentially depositing a base layer, an intermediate layer and a top layer with different composition ratios and film structures individually on the indexable insert.

It is another object of the present invention to provide a multi-layer hard film having improved abrasion resistance and oxidation resistance by depositing an A-layer, a B-layer, a C-layer, and a D-layer, which have different composition ratios, in the order of A/B/C/D or A/D/C/B, as one stacking cycle.

Technical Solution

In order to achieve the object of the present invention, there is provided a multi-layer film for a indexable insert, in which a base layer is deposited on a cemented carbide steel, such as an insert, and end mill, and a drill, or a cermet tool by physical vapor deposition in order to improve attachment force and align crystals of a surface 200, a multi-layer film of (Ti,Al)N, which is an intermediate layer, is sequentially deposited to improve shock resistance and chipping resistance, and then a top layer is formed by alternately stacking an A-layer, a B-layer, a C-layer, and a D-layer, [composition equation 1]:

the film composition ratio of the A,C-layers [Ti(1−x)Alx][C(1−y)Ny], $0.3 \leq x \leq 0.5$, $0.5 \leq y \leq 1$, [composition ratio 2]: the film composition ratio of the B-layer [Ti(1−q)Alq][C(1−r)Nr], $0.6 \leq q \leq 0.8$, $0.5 \leq r \leq 1$, and [composition ratio 3]: the film composition ratio of the D-layer[Al(1−(a+b))TiaMb]N; M[Si,Cr] $0.3 \leq a \leq 0.5$, $0.02 \leq b \leq 0.08$, the film composition of the base layer is implemented by the composition ratio 1, the film structure of the intermediate layer is a multi-layer film formed by depositing A-layer/B-layer/C-layer having the composition ratios 1 and 2, and the film structure of the top layer is formed by alternately stacking the A-layer, the B-layer, the C-layer, and the D-layer, which are implemented the composition ratios 1, 2, and 3 and have different composition ratios, in the order of A/B/C/D layers or A/D/C/B layers.

The thickness of a single film of (Ti,Al)N, which is the film of the base layer, is 0.05~0.7 μm, the thickness of the multi-layer film, which is the film of the intermediate layer, formed by alternately depositing the A/B/C layers implemented by the composition equations 1 and 2 is 1.0~20.0 μm and the multi-layer film structure has a stacking cycle within 1.0~50.0 nm, and, in the film structure of the top layer, the film composition ratios of the A-layer and the C-layer are the same, any one of the B-layer and the D-layer is necessarily and alternately stacked between the A-layer and the D-layer, the A,B,C, and D-layers make one stacking cycle (λ=1.0~50 nm), and the thickness of the top layer is 0.5~5 μm.

The film thickness including all of the base layer, the intermediate layer, and the top layer is in the range of 1.0~30.0 μm.

Meanwhile, features and advantages of the present invention will be made clear from the following detailed description based on the accompanying drawings. Terms or words used in the specification and claims herein should be not construed as a general and lexical meaning and should be construed as the meaning and concept meeting the technical idea of the present invention based on a principle that the present inventors can properly define the concepts of terms in order to elucidate their own invention in the best method.

Advantageous Effects

A multi-layer film for an indexable insert according to the present invention has improved attachment force and stable crystal alignment, by sequentially depositing a single film of (Ti,Al)N on the base layer, depositing a multi-layer film of (Ti,Al)N having improved shock resistance and chipping resistance on an intermediate layer, and then forming a multi-layer film of (Al,Ti,Si)N having improved abrasion resistance and oxidation resistance on a top layer, in order to depositing a multi-layer film on the surface of an indexable insert or a tool requiring abrasion resistance.

In particular, the (Ti,Al)N single film, which is the base layer, is provided for improvement of attachment force and crystal alignment of a surface 200, has a composition equation satisfying Ti(1−x)Alx (atom ratio, $0.3 \leq x \leq 0.5$)N and an average film thickness of 0.05~0.7 μm. The (Ti,Al)N multi-layer film, which is the intermediate layer, is provided for improving abrasion resistance and chipping resistance, implemented by alternately depositing two films, in which the composition equation of one of the films satisfies a single film of (Ti(1−z)Alz)N (atom ratio, $0.6 \leq z \leq 0.8$) and the composition equation of the other one satisfies a single film of (Ti(1−z)Alz)N (atom ratio, $0.3 \leq q \leq 0.5$), has an average film thickness of 1.0~20.0 μm and an average stacking cycle (λ) of 1.0~50.0 nm.

Further, the multi-layer film of (Al,Ti,Si)N, which is the top layer, is provided for improving abrasion resistance and oxidation resistance, in which the film structure is formed by alternately depositing an A-layer, a B-layer, a C-layer, and a D-layer having different composition ratios in the order of A/B/C/D or A/D/A/B. The composition equation of the A-layer and the B-layer which have the same composition ratio satisfies (Ti(1−x)Alx)N (atom ratio, $0.3 \leq z \leq 0.5$), the composition equation of the C-layer satisfies (Ti(1−q)Alq)N (atom ratio, $0.6 \leq q \leq 0.8$), and the composition equation of the D-layer satisfies [Al(1−(a+b))TiaSib]N (atom ratio, $0.3 \leq a \leq 0.5$, $0.02 \leq b \leq 0.08$), in which the average film thickness is 0.5~5.0 μm and the average stacking cycle (λ) is 1.0~50.0 nm.

Therefore, it is possible to manufacture an indexable insert that can minimize separation and abrasion which may occur in high-speed cutting, and considerable effects are expected in the industry.

MODE FOR INVENTION

Hereinafter, a multi-layer hard film for an indexable insert according to the present invention is described.

First, in describing the present invention, a detailed description of related known functions or configurations will be omitted so as not to obscure the subject of the present invention The present invention is characterized by forming a new film structures with individual layers of a base layer for improvement of attaching force and crystal arrangement on a surface 200, an intermediate layer having improved shock resistance and chipping resistance, and a top layer having improved abrasion resistance and oxidation resistance.

It is preferable to use an arc process or sputtering, which are widely known as physical vapor deposition, in order to achieve the present invention. According to the configuration of a device for the arc process, targets for forming metal components of a hard film is mounted to evaporation sources and deposited on a coating material mounted on a rotary table where predetermined voltage is applied, by supplying predetermined current.

Further, a nitrogen gas is additionally supplied into the device during deposition to deposit a complex nitride film. Arrangement of targets mounted to the evaporation sources is show in Table 1. As shown in Table 1, the composition ratios satisfy the composition equations and the table with the coating material rotates in accordance with the order of the first evaporation source, the second evaporation source, the third evaporation source, and the fourth evaporation source.

Further, the first evaporation source and third evaporation source, and the second evaporation source and the fourth evaporation source, are opposite to each other, respectively, around the table.

Therefore, a film of (Ti, Al) N is deposited by the first evaporation source and the third evaporation source to deposit the base layer, a multi-layer film of (Ti, Al) N with different content of Al is deposited by the first, second, and fourth evaporation sources to deposit the intermediate layer, and the top layer is deposited by the first, second, third, and fourth evaporation sources, in this order.

TABLE 1

| Sample Name | | Type of Target Mounted to Evaporation Source | | |
|---|---|---|---|---|
| | | First, Third Evaporation Source | Second Evaporation Source | Fourth Evaporation Source |
| A-1 | Composition Equation | $Ti_{(1-x)}Al_x$ | $Ti_{(1-y)}Al_y$ | $Al_{(1-(a+b))}Ti_aSi_b$ |
| | Composition Ratio | $0.3 \leq x \leq 0.5$ | $0.6 \leq y \leq 0.8$ | $0.3 \leq a \leq 0.5$ $0.02 \leq b \leq 0.08$ |
| A-2 | Composition Equation | $Ti_{(1-x)}Al_x$ | $Al_{(1-(a+b))}Ti_aSi_b$ | $Ti_{(1-y)}Al_y$ |
| | Composition Ratio | $0.3 \leq x \leq 0.5$ | $0.3 \leq a \leq 0.5$ $0.02 \leq b \leq 0.08$ | $0.6 \leq y \leq 0.8$ |
| A-3 | Composition Equation | $Ti_{(1-x)}Al_x$ | $Ti_{(1-y)}Al_y$ | $Al_{(1-(a+b))}Ti_aCr_b$ |
| | Composition Ratio | $0.3 \leq x \leq 0.5$ | $0.6 \leq y \leq 0.8$ | $0.3 \leq a \leq 0.5$ $0.02 \leq b \leq 0.08$ |
| A-4 | Composition Equation | $Ti_{(1-x)}Al_x$ | $Al_{(1-(a+b))}Ti_aCr_b$ | $Ti_{(1-y)}Al_y$ |
| | Composition Ratio | $0.3 \leq x \leq 0.5$ | $0.3 \leq a \leq 0.5$ $0.02 \leq b \leq 0.08$ | $0.6 \leq y \leq 0.8$ |

The deposition conditions include making an argon gas of 1000 sccm flow into the chamber and maintaining the voltage applied to the coating material within 150~400V, in order to remove first contaminants and an oxide film on the surface of the coating material.

This process is generally called etching. Thereafter, a nitrogen gas of 2000~3000 sccm is continuously put into the chamber and the voltage applied to the coating material is maintained within 30~200V. In this process, the current applied to the evaporation sources is maintained within 80~150 A, and the internal pressure of the chamber is maintained within 2.0~4.0 Pa. Next, the inside of the chamber is cooled by a nitrogen gas.

The deposition conditions are equivalently applied to deposition of the base layer, the intermediate layer, and the top layer, in which the layers are deposited with different film structures.

a) In the film structure of the base layer, the surface 200 having horizontal alignment with respect to the rake face and the relief face of a cutting blade by Al grows first in a single film of (Ti, Al) N, in which when the proportion of Ti to Al is less than 0.3, the alignment of the surface 200 is not sufficient, and crystallization of the surface 200 is not sufficient even if the proportion is above 0.5.

Further, when the film thickness is less than 0.05 μm, high alignment of the surface 200 reduces crystal alignment hysteresis effect to the hard coated layer of the top layer and also reduces that attachment property. Further, when the film is deposited at a thickness of 0.7 μm, the crystal alignment hysteresis effect and the attachment property can be sufficiently achieved.

b) In the film structure of the intermediate layer, the multi-layer film of (Ti, Al) N having different Al ratios is alternately deposited with single films having considerably different modulus of elasticity, such that shock resistance and toughness can be improved. That is, the single film of (Ti, Al) N with a small amount of Al has larger modulus of elasticity than the single film of (Ti, Al) N with a large amount of Al, and it is possible to control breakage of the tool and chipping due to shock applied to cutting, by adjusting the stacking cycle. When the film thickness is less than 1.0 μm, the crystal alignment of the surface 100 that has grown by the base layer may be deteriorated, and when the stacking cycle is less than 1.0 μm, the hardness may be reduced.

Further, when the film thickness is above 10.0 μm, self-separation may be caused by the high stress in the film itself, and when the stacking cycle is above 50.0 nm, it is difficult to control generation of dislocation and its movement between the films, such that the hardness may be reduced.

c) In the film structure of the top layer, it is possible to improve both of abrasion resistance and oxidation resistance by making the A-layer and the C-layer with the film of (Ti, Al) N having relatively high modulus of elasticity and making the B-layer and the D-layer with a film having relatively low modulus of elasticity while sequentially depositing the A/B/C/D layers.

That is, in the B-layer of the D-layer, the A/B/C/D layers or the A/D/C/B layers are alternately deposited in this order, by using a film of (Ti, Al) containing relatively large amount of Al as one film and using a film of (Al, Ti, Si) N or (Al, Ti, Cr) N containing Si or Cr as another film. In other words, the film composition ratios of the A-layer and the C-layer are the same while the B-layer and the D-layer have different film composition ratios, which is one cycle. The effect obtained by adding Si and Cr in the compositions is to improve abrasion resistance and oxidation resistance under high temperature, which is well known by various documents. However, the addition ratios and the film structures are different from each other, unlike the present invention.

In the composition ratio of the film (Al,Ti,Si)N or the film (Al,Ti,Cr)N, it is possible to further improve the hardness and the oxidation resistance only with the minimum amount, by making the ratio of Si or Cr within 0.02~0.08, and entire relative element ratio, including the base layer and the intermediate layer, within 0.005~0.02.

When the content of Si or Cr is above 0.02 in the entire metal element ratios, separation may be caused or the hardness may be reduced by the high stress. Further, the separation occurs even above 10.0 μm of film thickness, such that the stacking structure may be damaged. This is the same as the reasons setting the stacking cycle and the film thickness in the intermediate film structure.

<Embodiment 1>

As shown in the following Table 2, cutting performance was appraised for each stacking cycle of the intermediate layer and the top layer.

An indexable ball insert with double blades of Z10 and 30 mm diameter was used for milling test. Further, the cutting conditions were as follows. The peripheral speed was 317 m/min, the number of revolution was 4,000 rpm, the feedrate was 3,000 mm/min, the axis depth was 0.3 mm, the radial depth was 0.5 mm, and the workpiece was a heat-treated SKD11 type with surface hardness of about 50 (HRC), without using a lubricant.

Further, a ball end mill with double blade of Z10 and 6 mm diameter was used for an end mill cutting test. The cutting conditions were as follows. The peripheral speed was 376 m/min, the number of revolution was 20,000 rpm, the feedrate was 3,500 mm/min, the axis depth was 0.3 mm, the radial depth was 1.2 mm, and the workpiece was a heat-treated SKD11 type with surface hardness of about 50 (HRC), without using a lubricant.

As shown in Table 2, it could be seen that there was not a large difference in abrasion resistance between the multi-layer structure of AlTiSiN and the multi-layer structure of AlTiCrN in the film structure of the top layer, but there was a considerably difference in abrasion resistance for the stacking cycles of the multi-layer structures.

It could be seen that the reason is that when the stacking cycle exceeds a predetermined critical point, the abrasion resistance is significantly reduced, as well known as the results in many documents.

Therefore, it was seen that the abrasion resistance was particularly improved under the cutting conditions for high-speed machining by appropriately combining the stacking cycles and the film structures.

TABLE 2

| Item | Sample Name | Film Structure | | | | | Cutting Performance Test Result | |
|---|---|---|---|---|---|---|---|---|
| | | Base Layer | Intermediate Layer | | Top Layer | | Ball Insert | Ball End Mill |
| | | Film Structure | Film Structure | Stacking Cycle | Film Structure | Stacking Cycle | Abrasion of Relief Face (mm) | Abrasion of Relief Face (mm) |
| Invention | A-1 | TiAlN single film | TiAlN multi-layer film | 1~30 nm | TiAlN/AlTiSiN multi-layer film | 1~30 nm | 0.02 | 0.03 |
| | A-2 | | | 1~30 nm | | 30~50 nm | 0.04 | 0.05 |
| | A-3 | | | 30~50 nm | | 1~30 nm | 0.03 | 0.04 |
| | A-4 | | | 30~50 nm | | 30~50 nm | 0.07 | 0.08 |
| | B-1 | | | 1~30 nm | TiAlN/AlTiCrN multi-layer film | 1~30 nm | 0.05 | 0.06 |
| | B-2 | | | 1~30 nm | | 30~50 nm | 0.04 | 0.06 |
| | B-3 | | | 30~50 nm | | 1~30 nm | 0.06 | 0.07 |
| | B-4 | | | 30~50 nm | | 30~50 nm | 0.07 | 0.07 |
| Comparison | a-1 | | | 1~30 nm | TiAlN/AlTiSiN | 51~60 nm | 0.20 | 0.31 |
| | a-2 | | | 51~60 nm | multi-layer film | 1~30 nm | 0.30 | 0.35 |
| | a-3 | | | 1~30 nm | TiAlN/AlTiCrN | 51~60 nm | 0.15 | 0.21 |
| | a-4 | | | 51~60 nm | multi-layer film | 1~30 nm | 0.22 | 0.21 |

<Embodiment 2>

Table 3 shows whether there is separation according to whether the base layer is applied, and cutting performance result according to the film structure of the intermediate film structure. The function of the base layer is to improve the attachment force between the intermediate layer and the top layer by depositing a single film of TiAlN and to improve abrasion resistance and oxidation resistance by aligning the first-growing surface of the surface 200. The function of the intermediate layer is to increase chipping resistance and toughness and the cutting conditions were the same as the first embodiment described above.

It was possible to determine whether there is an effect of the important factor of the preset invention, in terms of toughness. An indexable ball insert with double blades of Z10 and 30 mm diameter was used for a limit feed cutting test. Further, the cutting conditions were as follows. The peripheral speed was 317 m/min, the number of revolution was 4,000 rpm, the feedrate was 3,000 mm/min, the axis depth was 0.3 mm, the radial depth was 0.5 mm, and the workpiece was a heat-treated SKD11 type with surface hardness of about 50 (HRC) and having a hole through the surface for locking. Further, damage of the cutting edge and the machining distance until chipping occurs were measured.

As a result, there was separation in the samples C3 and C4 without a base layer, and it was seen that the life span of the tool was reduced by chipping in the samples C1 and C2 without an intermediate layer.

TABLE 3

| Item | Sample Name | Film Structure | | | Limit Feed Machining Distance Until Damage (m) | Cutting Edge Separation (before machining) |
|---|---|---|---|---|---|---|
| | | Base Layer | Stacking Cycle of Intermediate Layer (20 nm) | Stacking Cycle of Top Layer (20 nm) | | |
| Invention | C-1 | TiAlN single film | TiAlN Multi-layer film | TiAlN/AlTiSiN multi-layer film | 300 | No |
| | C-2 | TiAlN single film | TiAlN Multi-layer film | TiAlN/AlTiCrN multi-layer film | 295 | No |
| Comparison | c-1 | TiAlN single film | | TiAlN/AlTiSiN multi-layer film | 180 (chipping) | No |
| | c-2 | TiAlN single film | | TiAlN/AlTiCrN multi-layer film | 170 (chipping) | No |
| | c-3 | | TiAlN Multi-layer film | TiAlN/AlTiSiN multi-layer film | 100 | No |
| | c-4 | | TiAlN Multi-layer film | TiAlN/AlTiCrN multi-layer film | 110 | No |

Meanwhile, the present invention is not limited to the embodiment described herein and it should be understood that the present invention may be modified and changed in various ways without departing from the spirit and the scope of the present invention. Therefore, it should be appreciated that the modifications and changes are included in the claims of the present invention.

The invention claimed is:

1. A multi-layer film for a indexable insert, comprising:
    a base layer deposited on a cemented carbide steel by physical vapor deposition in order to improve attachment force and align crystals of a surface 200,
    a multi-layer film of (Ti,Al)N, which is an intermediate layer, sequentially deposited to improve shock resistance and chipping resistance, and
    a top layer formed by alternately stacking an A-layer, a B-layer, a C-layer, and a D-layer, [composition equation 1]: the film composition ratio of the A,C-layers [Ti(1-x)Alx][C(1-y)Ny], $0.3 \leq x \leq 0.5$, $0.5 \leq y \leq 1$, [composition equation 2]: the film composition ratio of the B-layer [Ti(1-q)Alq][C(1-r)Nr], $0.6 \leq q \leq 0.8$, $0.5 \leq r \leq 1$, and [composition equation 3]: the film composition ratio of the D-layer [Al(1-(a+b))TiaMb]N; M[Si,Cr] $0.3 \leq b \leq 0.08$,
    wherein the film composition of the base layer is implemented by the composition equation 1, the film structure of the intermediate layer is a multi-layer film formed by depositing A-layer/B-layer/C-layer having the composition equations 1 and 2, and the film structure of the top layer is formed by alternately stacking the A-layer, the B-layer, the C-layer, and the D-layer, which are implemented the composition equations 1, 2, and 3 and have different composition ratios, in the order of A/B/C/D layers or A/D/C/B layers.

2. The multi-layer film for a indexable insert according to claim 1, wherein the thickness of a single film of (Ti,Al)N, which is the film of the base layer, is 0.05~7 μm, the thickness of the multi-layer film, which is the film of the intermediate layer, formed by alternately depositing the A/B/C layers implemented by the composition equations 1 and 2 is 1.0~20.0 μm and the multi-layer film structure has a stacking cycle within 1.0~50.0 nm, and, in the film structure of the top layer, the film composition ratios of the A-layer and the C-layer are the same, any one of the B-layer and the D-layer is necessarily and alternately stacked between the A-layer and the D-layer, the A,B,C, and D-layers make one stacking cycle ($\lambda$=1.0~50 nm), and the thickness of the top layer is 0.5~5 um.

3. The multi-layer film for a indexable insert according to claim 1, wherein the film thickness including all of the base layer, the intermediate layer, and the top layer is in the range of 1.0~30.0 μm.

* * * * *